United States Patent
Mauri et al.

(10) Patent No.: US 7,751,156 B2
(45) Date of Patent: Jul. 6, 2010

(54) DUAL-LAYER FREE LAYER IN A TUNNELING MAGNETORESISTANCE (TMR) ELEMENT

(75) Inventors: Daniele Mauri, San Jose, CA (US); Satoshi Shigematsu, Yokohama Kanagawa (JP); Alexander M. Zeltser, San Jose, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 721 days.

(21) Appl. No.: 11/536,891

(22) Filed: Sep. 29, 2006

(65) Prior Publication Data

US 2008/0080101 A1   Apr. 3, 2008

(51) Int. Cl.
G11B 5/39 (2006.01)
(52) U.S. Cl. .............. 360/324.2; 360/324.12
(58) Field of Classification Search .......... 360/324.1, 360/324.11, 324.12, 324.2
See application file for complete search history.

(56) References Cited

U.S. PATENT DOCUMENTS

| | | | |
|---|---|---|---|
| 6,347,049 B1 | 2/2002 | Childress et al. | |
| 6,819,532 B2 | 11/2004 | Kamijo | |
| 7,315,053 B2* | 1/2008 | Hosomi et al. | 257/295 |
| 2002/0034055 A1* | 3/2002 | Seyama et al. | 360/324.11 |
| 2003/0161080 A1* | 8/2003 | Ishikawa et al. | 360/324.12 |
| 2003/0184925 A1* | 10/2003 | Hasegawa et al. | 360/324.12 |
| 2004/0229430 A1* | 11/2004 | Findeis et al. | 438/257 |
| 2005/0019610 A1 | 1/2005 | Fujikata et al. | |
| 2005/0052790 A1 | 3/2005 | Hayakawa | |
| 2005/0152076 A1* | 7/2005 | Nagasaka et al. | 360/324.1 |
| 2005/0195534 A1* | 9/2005 | Gill | 360/324.12 |
| 2005/0219770 A1 | 10/2005 | Gill | |
| 2005/0226043 A1 | 10/2005 | Parkin et al. | |
| 2005/0238924 A1* | 10/2005 | Gill | 428/837 |
| 2005/0260772 A1 | 11/2005 | Horng et al. | |
| 2005/0270702 A1* | 12/2005 | Komagaki et al. | 360/319 |
| 2005/0276099 A1 | 12/2005 | Horng et al. | |
| 2006/0119989 A1* | 6/2006 | Seyama et al. | 360/324.1 |
| 2006/0209590 A1* | 9/2006 | Guo et al. | 365/158 |
| 2006/0232894 A1* | 10/2006 | Hayashi et al. | 360/324.12 |
| 2007/0070553 A1* | 3/2007 | Tsunekawa et al. | 360/313 |
| 2007/0297090 A1* | 12/2007 | Gill | 360/123 |
| 2008/0180862 A1* | 7/2008 | Djayaprawira et al. | 360/324.2 |
| 2008/0239589 A1* | 10/2008 | Guo et al. | 360/324.12 |
| 2008/0239591 A1* | 10/2008 | Fuji et al. | 360/324.12 |
| 2009/0046397 A1* | 2/2009 | Sun et al. | 360/324.11 |
| 2009/0097170 A1* | 4/2009 | Sato et al. | 360/324.12 |
| 2009/0155629 A1* | 6/2009 | Gill | 428/828.1 |

* cited by examiner

*Primary Examiner*—Jefferson Evans
(74) *Attorney, Agent, or Firm*—Duft Bornsen & Fishman, LLP

(57) ABSTRACT

Tunneling magnetoresistive (TMR) elements and associated methods of fabrication are disclosed. In one embodiment, the TMR element includes a ferromagnetic pinned layer structure, a tunnel barrier layer, and a free layer having a dual-layer structure. In one embodiment, the free layer includes a first amorphous free layer and a second amorphous free layer. In another embodiment, the free layer includes a first polycrystalline free layer and a second amorphous free layer. The compositions of the first free layer and the second free layer of the dual layer structure differ to provide improved TMR performance and controlled magnetostriction. In one example, the first free layer may have a composition optimized for TMR while the second free layer may have a composition optimized for magnetostriction.

19 Claims, 9 Drawing Sheets

DUAL-LAYER FREE LAYER IN A TUNNELING MAGNETORESISTANCE (TMR) ELEMENT

BACKGROUND OF THE INVENTION

1. Field of the Invention

The invention is related to the field of magnetoresistance (MR) elements and, in particular, to tunneling magnetoresistance (TMR) elements having a free layer formed from dual ferromagnetic layers.

2. Statement of the Problem

Many computer systems use magnetic disk drives for mass storage of information. Magnetic disk drives typically include one or more recording heads (sometimes referred to as sliders) that include read elements and write elements. A suspension arm holds the recording head above a magnetic disk. When the magnetic disk rotates, an air flow generated by the rotation of the magnetic disk causes an air bearing surface (ABS) side of the recording head to ride a particular height above the magnetic disk. The height depends on the shape of the ABS. As the recording head rides on the air bearing, an actuator moves an actuator arm that is connected to the suspension arm to position the read element and the write element over selected tracks of the magnetic disk.

To read data from the magnetic disk, transitions on a track of the magnetic disk create magnetic fields. As the read element passes over the transitions, the magnetic fields of the transitions modulate the resistance of the read element. The change in resistance of the read element is detected by passing a sense current through the read element, and then measuring the change in bias voltage across the read element. The resulting read back signal is used to recover the data encoded on the track of the magnetic disk.

The most common type of read elements are magnetoresistance (MR) read elements. One type of MR read element is a Giant MR (GMR) read element. GMR read elements having two layers of ferromagnetic material (e.g., CoFe) separated by a nonmagnetic spacer layer (e.g., Cu) are generally referred to as spin valve (SV) elements. A simple-pinned SV read element generally includes an antiferromagnetic (AFM) pinning layer (e.g., PtMn), a ferromagnetic pinned layer (e.g., CoFe), a nonmagnetic spacer layer (e.g., Cu), and a ferromagnetic free layer (e.g., CoFe). The ferromagnetic pinned layer has its magnetization fixed by exchange coupling with the AFM pinning layer. The AFM pinning layer generally fixes the magnetic moment of the ferromagnetic pinned layer perpendicular to the ABS of the recording head. The magnetization of the ferromagnetic free layer is not fixed and is free to rotate in response to an external magnetic field from the magnetic disk.

Another type of SV read element is an antiparallel (AP) pinned SV read element. The AP-pinned SV read element differs from the simple pinned SV read element in that an AP-pinned structure has multiple thin film layers forming the pinned layer structure instead of a single pinned layer. The pinned layer structure includes a first ferromagnetic pinned (keeper) layer (e.g., CoFe), a nonmagnetic spacer layer (e.g., Ru), and a second ferromagnetic pinned (reference) layer (e.g., CoFe). The first ferromagnetic pinned (keeper) layer has a magnetization oriented in a first direction perpendicular to the ABS by exchange coupling with the AFM pinning layer. The second ferromagnetic pinned (reference) layer is antiparallel coupled with the first ferromagnetic pinned (keeper) layer across the spacer layer. Accordingly, the magnetization of the second ferromagnetic pinned (reference) layer is oriented in a second direction that is antiparallel to the direction of the magnetization of the first ferromagnetic pinned (keeper) layer.

Another type of MR read element is a Tunneling MR (TMR) read element. TMR read elements differ from GMR elements in that a thin, electrically insulating, tunnel barrier layer (e.g., aluminum oxide or magnesium oxide) is used between the ferromagnetic pinned layer and the ferromagnetic free layer instead of a nonmagnetic spacer layer (e.g., Cu). The TMR read elements may be simple pinned or AP-pinned as with the GMR read elements.

The composition and configuration of the ferromagnetic free layer of TMR read elements may vary depending on desired implementations. For instance, the free layer in one type of TMR read element may include a single layer of material having a polycrystalline structure, such as CoFe or NiFe. The free layer in another type of TMR read element may include a single layer of material having an amorphous structure, such as CoFeB or CoFeNiB. The free layer in another type of TMR read element may include a multilayer structure comprised of polycrystalline materials (e.g., CoFe/NiFe/CoFe).

One problem with designing TMR read elements is that it is desirable to have both high TMR and controlled magnetostriction. It is desirable for the magnetostriction to be small (roughly between $-4 \times 10^{-6}$ and $+4 \times 10^{-6}$). The combination of typical prevailing mechanical stresses at the ABS with a negative magnetostriction helps to stabilize the free layer's magnetization parallel to the ABS, which is desirable for stable operation. While a small and negative magnetostriction is thus beneficial, an excessively large and negative magnetostriction should be avoided because it would over-stabilize the free layer and reduce its sensitivity.

A positive magnetostriction combined with the ABS mechanical stress generates a torque which tends to rotate the free layer magnetization in a direction perpendicular to the ABS. This could magnetically destabilize the sensor if the magnetostriction were sufficiently large and positive. For this reason a positive magnetostriction should be kept small. Therefore, in general the absolute value of magnetostriction should be small for optimal operation. In the case of CoFe or CoFeB, which are commonly used in the free layer of present TMR read elements, higher Fe content generally increases TMR but also increases magnetostriction.

A free layer comprised of a pure amorphous material has been shown to have very large TMR coefficient but less than ideal magnetic properties. When looking for alternative free layers, one may consider that conventional free layers used in GMR sensors comprise two sub-layers of CoFe and NiFe. The CoFe is employed to enhance the MR effect whereas the NiFe is added to improve the magnetic quality and control magnetostriction of the combined free layer. The same CoFe/NiFe free layer may be employed in the TMR stack but at a substantial loss of TMR. Another alternative is a pure CoFe free layer that can also deliver large TMR values but has the same shortcomings of the pure amorphous CoFeB free layer, namely poor magnetic properties. This is corroborated by the fact that pure CoFe free layers, as practiced in GMR sensors, exhibit worse magnetic stability than CoFe/NiFe free layers.

SUMMARY OF THE SOLUTION

The invention solves the above and other related problems with an improved TMR element having a free layer with a dual-layer structure that allows for high TMR with reduced magnetostriction. The TMR element includes a ferromagnetic pinned layer structure, a tunnel barrier layer, and a free layer with a dual-layer structure. In one embodiment, the dual-layer free layer includes a first ferromagnetic amorphous free layer and a second ferromagnetic amorphous free layer. In another embodiment, the dual-layer free layer includes a first ferromagnetic polycrystalline free layer and a second ferromagnetic amorphous free layer. The dual-layer free layers as described herein advantageously have less magnetostriction as compared to previous TMR elements, while still maintaining high TMR.

The compositions of the first ferromagnetic free layer and the second ferromagnetic free layer may differ to provide the improved performance. In one example, the first ferromagnetic free layer may have a composition optimized for TMR while the second ferromagnetic free layer may have a composition optimized for magnetostriction. The first ferromagnetic free layer may be optimized for TMR by having a first atomic percentage of Fe that is acceptable for TMR, while the second ferromagnetic free layer may be optimized for magnetostriction by having a second atomic percentage of Fe that is less than the first atomic percentage of the first ferromagnetic free layer.

The invention may include other exemplary embodiments described below. For instance, other exemplary embodiments comprise methods of fabricating TMR elements described herein.

DESCRIPTION OF THE DRAWINGS

The same reference number represents the same element or same type of element on all drawings.

DETAILED DESCRIPTION OF THE INVENTION

FIGS. 1-16 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Dual Amorphous Free Layers—FIGS. 1-11

Figure 1:
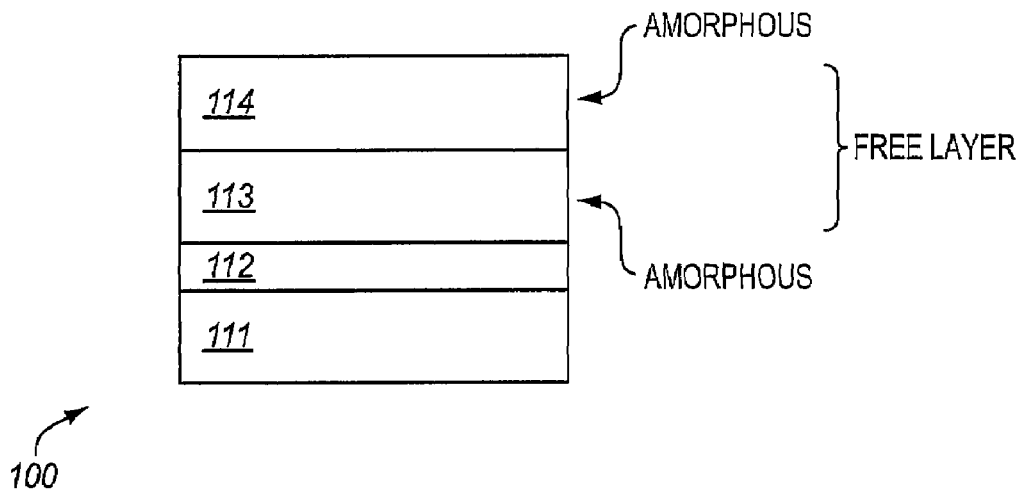
FIG. 1 illustrates a TMR element in an exemplary embodiment of the invention.

FIG. 1 illustrates a TMR element 100 in an exemplary embodiment of the invention. FIG. 1 is a view from the air bearing surface (ABS) of TMR element 100. TMR element 100 includes a ferromagnetic pinned layer structure 111, a tunnel barrier layer 112, a first ferromagnetic amorphous free layer 113, and a second ferromagnetic amorphous free layer 114. Those skilled in the art understand that TMR element 100 may include other layers in other exemplary embodiments, such as biasing layers, seed layers, shields, etc.

Figure 2:
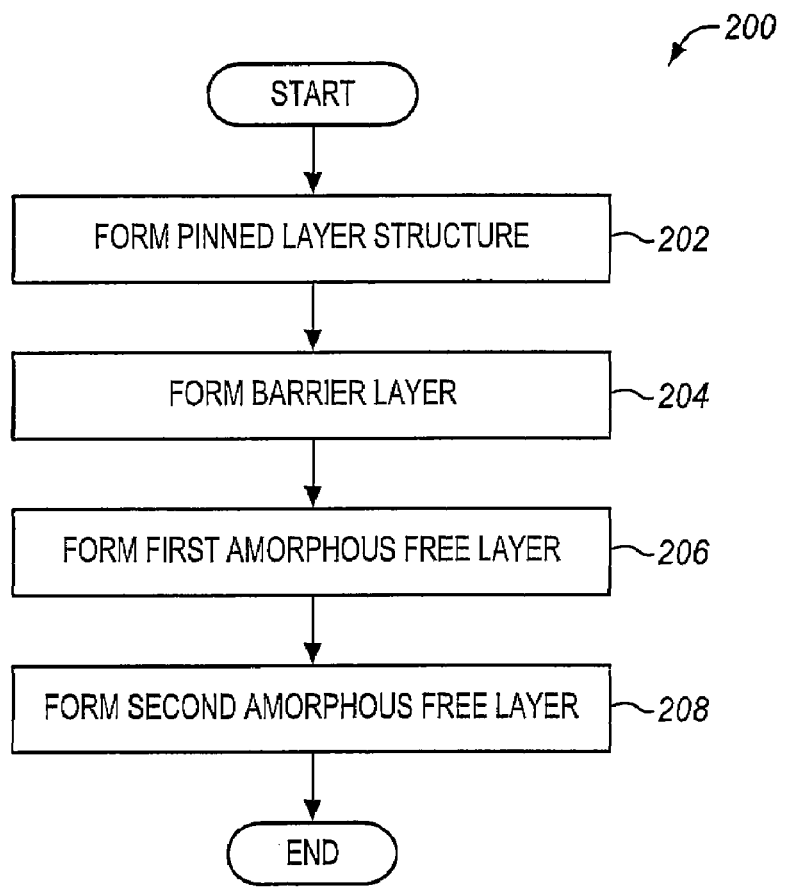
FIG. 2 is a flow chart illustrating a method of fabricating the TMR element shown in FIG. 1 in an exemplary embodiment.

FIG. 2 is a flow chart illustrating a method 200 of fabricating TMR element 100 shown in FIG. 1 in an exemplary embodiment. The steps of the flow chart in FIG. 2 are not all inclusive and may include other steps not shown. For instance, a shield may be formed or deposited on a substrate, one or more seed layers may be formed or deposited, an AFM pinning layer may be formed or deposited, etc.

In step 202, a ferromagnetic pinned layer structure 111 is formed. Pinned layer structure 111 may be a simple pinned structure or an AP-pinned structure. Pinned layer structure 111 may be formed from polycrystalline materials such as CoFe, or may be formed from amorphous materials such as CoFeB. In step 204, a tunnel barrier layer 112 is formed. Tunnel barrier layer 112 may be formed from magnesium oxide, aluminum oxide, or a similar material.

In step 206, a first ferromagnetic amorphous free layer 113 is formed. In step 208, a second ferromagnetic amorphous free layer 114 is formed. These layers may be formed in many desired ways.

The first amorphous free layer 113 and the second amorphous free layer 114 are formed with amorphous materials, such as CoFeB. When the first amorphous free layer 113 and the second amorphous free layer 114 are termed "amorphous", the free layers 113-114 are amorphous as formed or deposited. When amorphous materials are grown on polycrystalline materials, the amorphous materials can take on a polycrystalline structure on the surface touching the polycrystalline material. Thus, the first amorphous free layer 113 (and possibly the second amorphous free layer 114) may partially take on a polycrystalline structure after being deposited or annealed, all of which is within the scope of the invention.

The two amorphous free layers 113-114 provide improved performance over prior TMR elements that implement either a single free layer or implement multilayer free layer using polycrystalline materials. The compositions of the first amorphous free layer 113 and the second amorphous free layer 114 differ to provide the improved performance. In one example, the first amorphous free layer 113 may have a composition optimized for TMR while the second amorphous free layer 114 may have a composition optimized for magnetostriction. If the first amorphous free layer 113 is comprised of CoFeB, then to optimize for TMR the first amorphous free layer 113 may have a first atomic percentage of Fe (e.g., a composition of approximately Co60Fe20B20) that is desirable or acceptable for TMR. If the second amorphous free layer 114 is also comprised of CoFeB, then to optimize for magnetostriction the second amorphous free layer 114 may have a second atomic percentage of Fe (e.g., a composition of approximately Co72Fe8B20) that is less than the first atomic percentage of Fe on the first amorphous free layer 113.

Because Fe substantially contributes to the magnetostriction of a free layer formed from CoFeB, the reduction in Fe in the second amorphous free layer 114 is optimal for magnetostriction as compared to the first amorphous free layer 113. However, because the first amorphous free layer 113 has a higher concentration of Fe as compared to the second amorphous free layer 114, the first amorphous free layer 113 is optimal for TMR.

Figure 3:
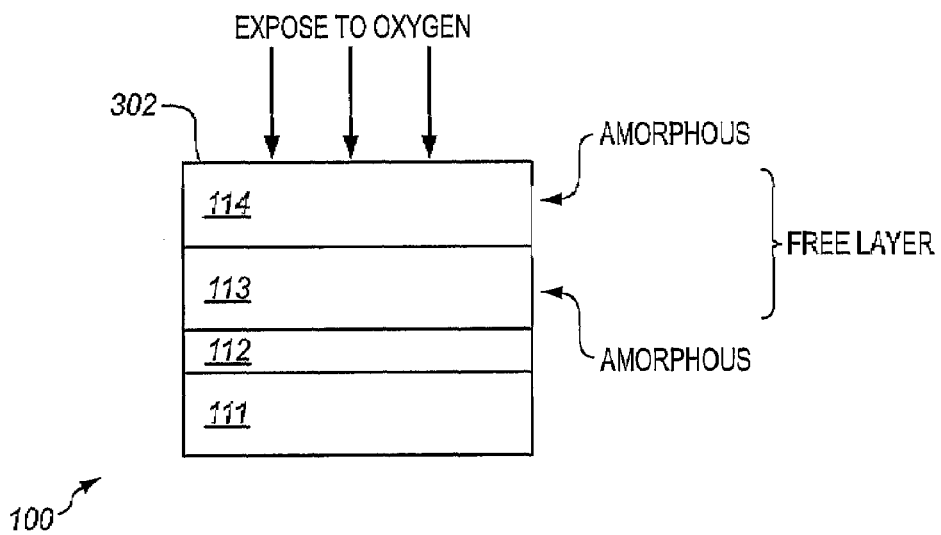
FIG. 3 illustrates a TMR element in another exemplary embodiment.

FIG. 3 illustrates TMR element 100 in another exemplary embodiment of the invention. FIG. 3 is again a view from the ABS of TMR element 100. TMR element 100 in FIG. 3 includes the same layers as in FIG. 1. According to features and aspects herein, the second amorphous free layer 114 is exposed to oxygen in this embodiment. More particularly, the top surface 302 of the second amorphous free layer 114 is exposed to oxygen. The second amorphous free layer 114 may be exposed to oxygen according to many different desired methods. For instance, oxygen may be applied to the top surface 302 of the second amorphous free layer 114 at a particular pressure (e.g., $10^{-4}$ TORR) and temperature (e.g., room temperature) for a time period (e.g., 60 seconds). In another example, an oxygen plasma process may be used to expose the second amorphous free layer 114 to oxygen. In another example, the second amorphous free layer 114 may be exposed to an oxygen radical.

The oxygen exposure further optimizes magnetostriction in the second amorphous free layer 114. Magnetostriction includes a volume component and a surface component. Because the second amorphous free layer 114 is so thin (e.g., between about 10-30 Å), the surface component of magnetostriction is significant. Thus, by exposing top surface 302 to oxygen, the overall magnetostriction of the second amorphous free layer 114 is further reduced. In some examples, the magnetostriction of the second amorphous free layer 114 may be negative after exposure to oxygen.

The oxygen exposure of the second amorphous free layer 114 should not be significant enough or aggressive enough to substantially affect the overall resistance of TMR element 100. If the oxygen exposure is too high, then the second amorphous free layer 114 will become oxidized and would in essence comprise a second tunnel barrier layer that would significantly affect the overall resistance of TMR element 100. One determining factor in whether the oxygen exposure is too high is the process used for the oxygen exposure, examples of which were discussed above. Another determining factor is the overall thickness of the two amorphous free layers 113 and 114. If the combined free layer 113 and 114 is too thin, then even a very light oxygen exposure can significantly increase the device resistance, which may not be desirable for device performance. If the combined free layer 113 and 114 is too thick, then the surface component of magnetostriction is overshadowed by the volume component, and the oxygen treatment has little effect. Thus, a thickness of between about 10-30 Å may provide the desired results to the oxygen treatment.

Figure 4:
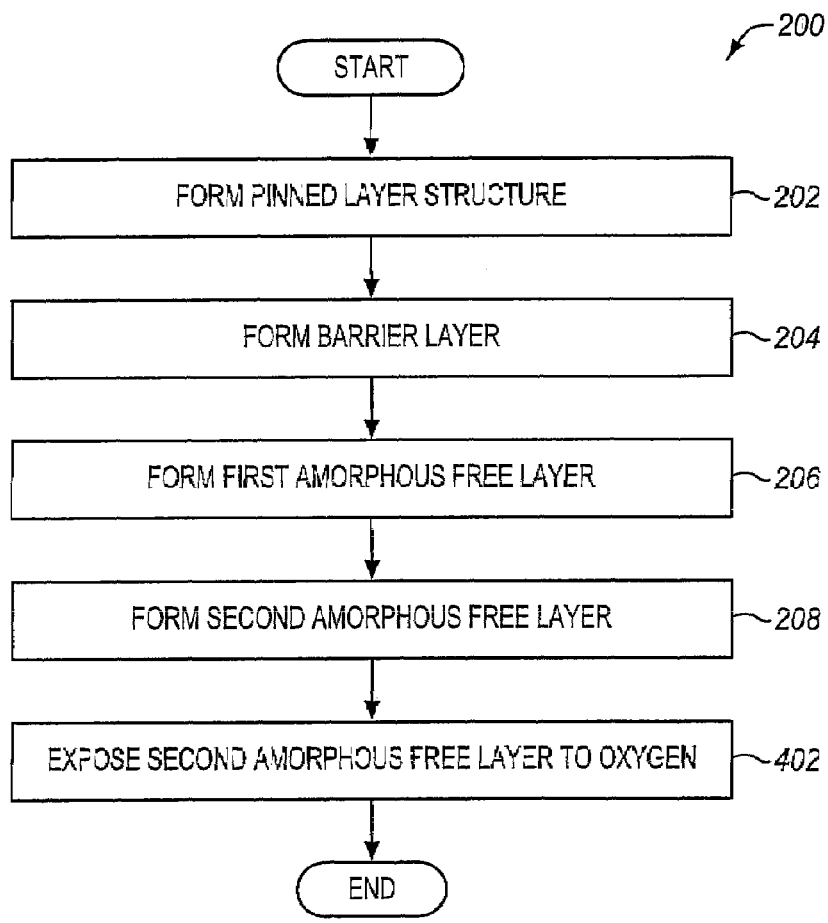
FIG. 4 is a flow chart illustrating the further step of the method of fabricating the TMR element shown in FIG. 3.

FIG. 4 is a flow chart illustrating the further step of method 200 of fabricating the TMR element 100 shown in FIG. 3. The further step 402 includes exposing the second amorphous free layer 114 to oxygen.

Figure 5:
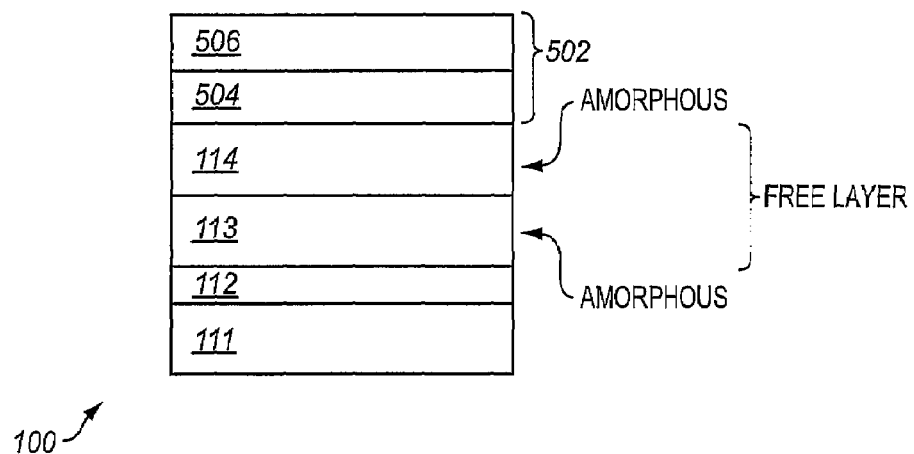
FIG. 5 illustrates a TMR element in another exemplary embodiment.

FIG. 5 illustrates TMR element 100 in another exemplary embodiment of the invention. FIG. 5 is again a view from the ABS of TMR element 100. TMR element 100 in this embodiment further includes a cap layer structure 502. The cap layer structure 502 includes a first cap layer 504 and a second cap layer 506.

The first cap layer 504 is formed from a material having a substantially low reactivity with oxygen. Because the second amorphous free layer 114 is exposed to oxygen to reduce magnetostriction in FIG. 4, the first cap layer 504, which is formed adjacent to the top surface 302 of the second amorphous free layer 114 that was oxygen treated (see also FIG. 3), should be non-reactive or substantially non-reactive to oxygen in order to avoid negating the effects of the oxygen treatment on the second amorphous free layer 114. One example of a material that has a substantially low reactivity with oxygen is Ru.

The second cap layer 506 is formed from a material that provides good electrical contact with a lead or a shield that is subsequently formed on the second cap layer 506. One example of a material that may be used for the second cap layer 506 is Ta.

Figure 6:
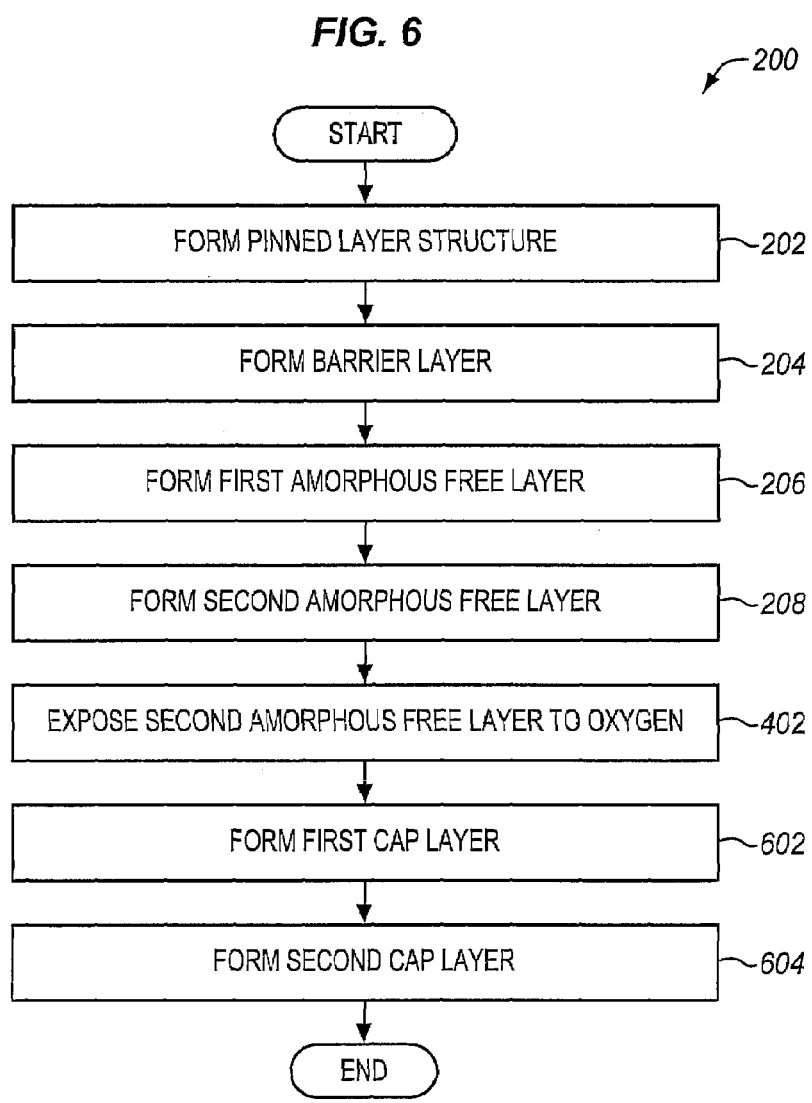
FIG. 6 is a flow chart illustrating the further steps of the method of fabricating the TMR element shown in FIG. 5.

FIG. 6 is a flow chart illustrating the further steps of method 200 of fabricating the TMR element 100 shown in FIG. 5. The further step 602 includes forming a first cap layer 504 on the second amorphous free layer 114. The further step 604 includes forming a second cap layer 506 on the first cap layer 504.

Figure 7:
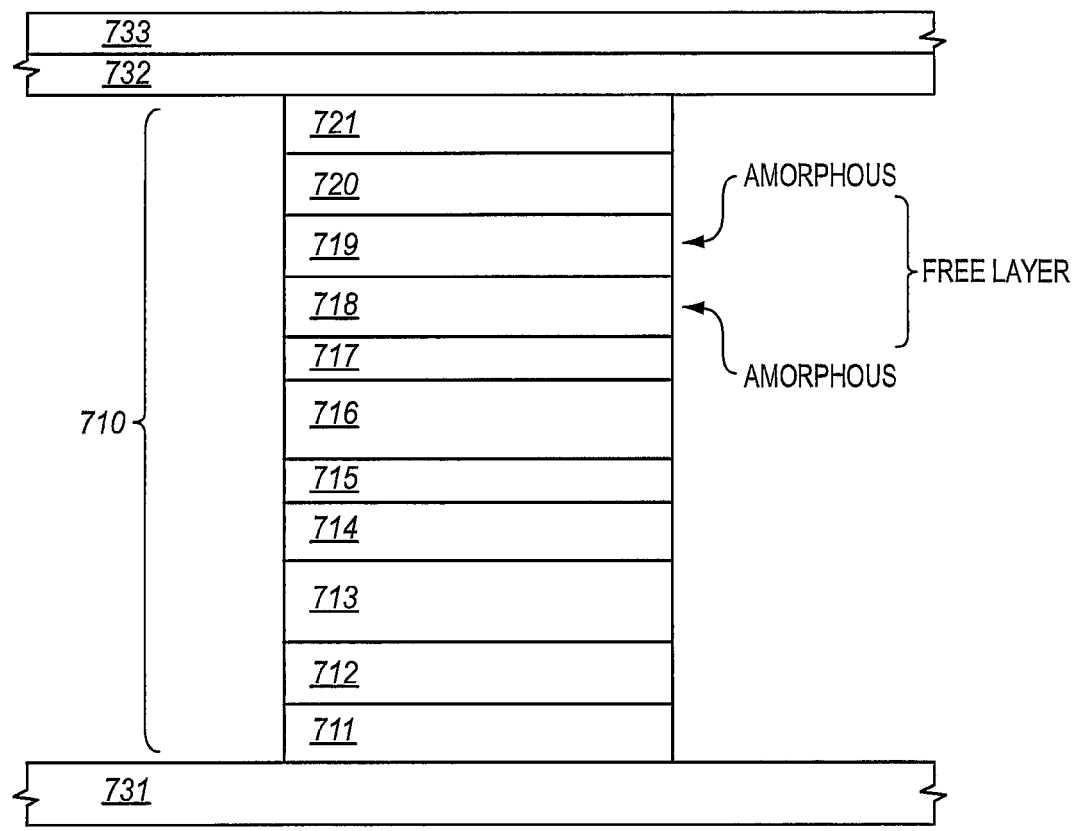
FIG. 7 illustrates a TMR element in another exemplary embodiment.

FIG. 7 illustrates a TMR element 700 in another exemplary embodiment. FIG. 7 is a view from the ABS of TMR element 700. TMR element 700 is a detailed embodiment that is in no way intended to limit the scope of the invention, as exemplary layers of TMR element 700 are shown. Those skilled in the art understand that TMR element 700 may include other layers in other exemplary embodiments.

In FIG. 7, TMR element 700 includes a TMR sensor 710 sandwiched between a first shield 731 and a second shield 733. The first shield 731 and the second shield 733 may be formed from NiFe or a similar material. The top lead layer 732 is formed from a conductive but non-magnetic material, such as Ta. Its main purpose is to set the desired spacing between the two magnetic shields 731 and 733. TMR sensor 710 includes a first seed layer 711 formed from Ta, and a second seed layer 712 formed from Ru, and an antiferromagnetic (AFM) pinning layer 713 formed from IrMnCr. Alternatively, seed layer 711 and seed layer 712 may be formed from Ta/NiFeCr/NiFe having thicknesses of 30 Å/20 Å/8 Å, respectively. TMR sensor 710 also includes a pinned layer structure comprising a ferromagnetic pinned (keeper) layer 714 formed from CoFe, a nonmagnetic spacer layer 715 formed from Ru, and a ferromagnetic amorphous pinned (reference) layer 716 formed from CoFeB. TMR sensor 710 further includes a tunnel barrier layer 717 formed from magnesium oxide, a first ferromagnetic amorphous free layer 718 formed from CoFeB, a second ferromagnetic amorphous free layer 719 formed from CoFeB, a first cap layer 720 formed from Ru, and a second cap layer 721 formed from Ta. The materials given for the layers of TMR sensor 710 are just examples and other materials may be used.

The following lists some exemplary thicknesses of the layers of TMR sensor 710. The first seed layer 711 formed from Ta is approximately 30 Å, the second seed layer 712 formed from Ru is approximately 20 Å, AFM pinning layer 713 formed from IrMnCr is approximately 60 Å, pinned (keeper) layer 714 formed from CoFe is approximately 18 Å, spacer layer 715 formed from Ru is less than about 5 Å, pinned (reference) layer 716 formed from CoFeB is approximately 26 Å, tunnel barrier layer 717 is approximately 9 Å, the first amorphous free layer 718 formed from CoFeB is approximately 17 Å, the second amorphous free layer 719 formed from CoFeB is between about 10-30 Å, the first cap layer 720 formed from Ru is approximately 60 Å, and the second cap layer 721 formed from Ta is approximately 30 Å. The thicknesses provided above are just examples and other material thicknesses may be used.

TMR element 700 differs from prior TMR elements in that the free layer comprises a dual layer structure of ferromagnetic amorphous free layers 718-719. The compositions of the first amorphous free layer 718 and the second amorphous free layer 719 differ to provide the improved performance. First amorphous free layer 718 has a composition of approximately Co60Fe20B20, while the second amorphous free layer 719 has a composition of approximately Co72Fe8B20. The higher content of Fe in the first amorphous free layer 718 is optimized for TMR while the lower content of Fe in the second amorphous free layer 719 is optimized for magnetostriction.

One key to the high TMR using MgO is achieving CoFeX/MgO/CoFeX, with crystalline and highly oriented (100) MgO barriers surrounded by crystalline CoFeX on both sides. It may seem contradictory to try to achieve a crystalline and well oriented CoFeX/MgO/CoFeX using an amorphous CoFeB pinned layer 716. However, when MgO barrier layer 717 is deposited on the amorphous CoFeB pinned layer 716, it spontaneously grows with a very strong 100 crystallographic orientation. During anneal, the CoFeB immediately contacting the MgO barrier layer 717 crystallizes thus forming the desired CoFeX/MgO/CoFeX structure, and gives rise to very large TMR coefficients. Using a polycrystalline (i.e., not amorphous) reference layer 716 typically produces much less optimal MgO layers and thus lower final TMR. To achieve high TMR coefficient and high AFM pinning, TMR elements with a first amorphous free layer are annealed at temperatures ranging from 260 to 320° C., while TMR elements with a first polycrystalline free layer can be annealed at lower temperatures ranging from 220 to 320° C. In both cases, anneal is performed in a vacuum in the presence of a magnetic aligning field.

Figure 8:
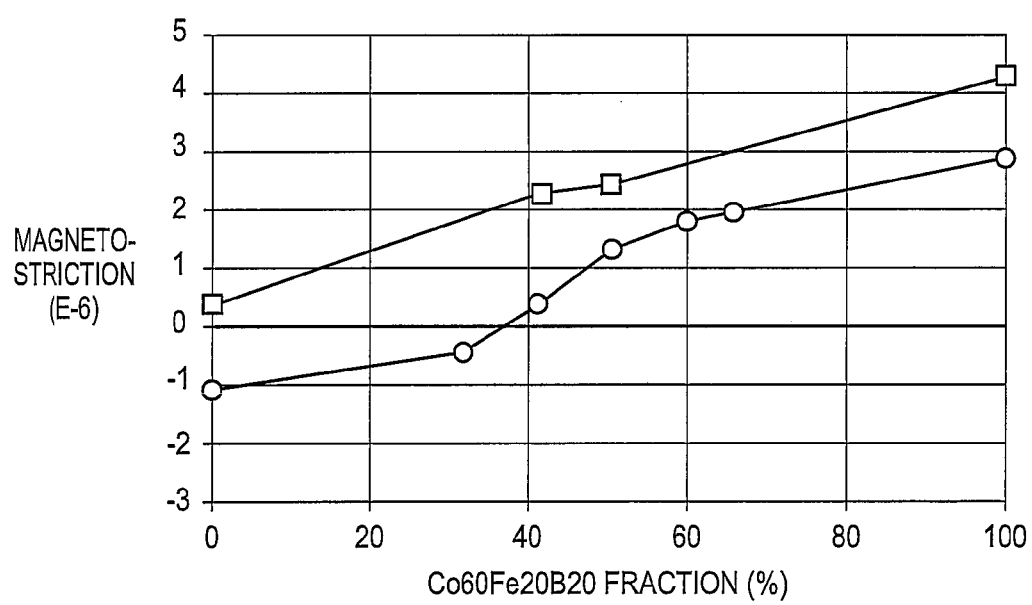
FIG. 8 is a graph illustrating magnetostriction of the free layer as a function Fe composition in an exemplary embodiment.

The second amorphous free layer 719 is exposed to oxygen during fabrication in a manner as described in FIG. 4. The oxygen treatment reduces the magnetostriction of the free layer of TMR element 700, even to negative levels. FIG. 8 is a graph illustrating magnetostriction as a function of free layer composition in an exemplary embodiment. The graph shows magnetostriction for a free layer having a total magnetic thickness equivalent to 45 Å of NiFe. This corresponds to an areal magnetization of 0.315 memu/cm$^2$. The free layer includes a layer of Co60Fe20B20 and a layer of Co72Fe8B20. This magnetic free layer thickness may be formed with different proportions of the Co60Fe20B20 layer and the Co72Fe8B20 layer. The X-axis of the graph illustrates the fraction of Co60Fe20B20 in the free layer.

The square data points in FIG. 8 illustrate magnetostriction without oxygen treatment. The circle data points in FIG. 8 illustrate magnetostriction with oxygen treatment. As is evident from the square data points and the circle data points, magnetostriction rises monotonically with the fraction of Co60Fe20B20. A fraction of about 50% gives approximately 2.5E-6 (without oxygen), which is well within the approximate upper magnetostriction boundary. The circle data points show that oxygen treatment reduces the magnetostriction of the free layer. When the percentage of the Co60Fe20B20 layer is below about 40%, the magnetostriction even becomes negative which is very advantageous.

Figure 9:
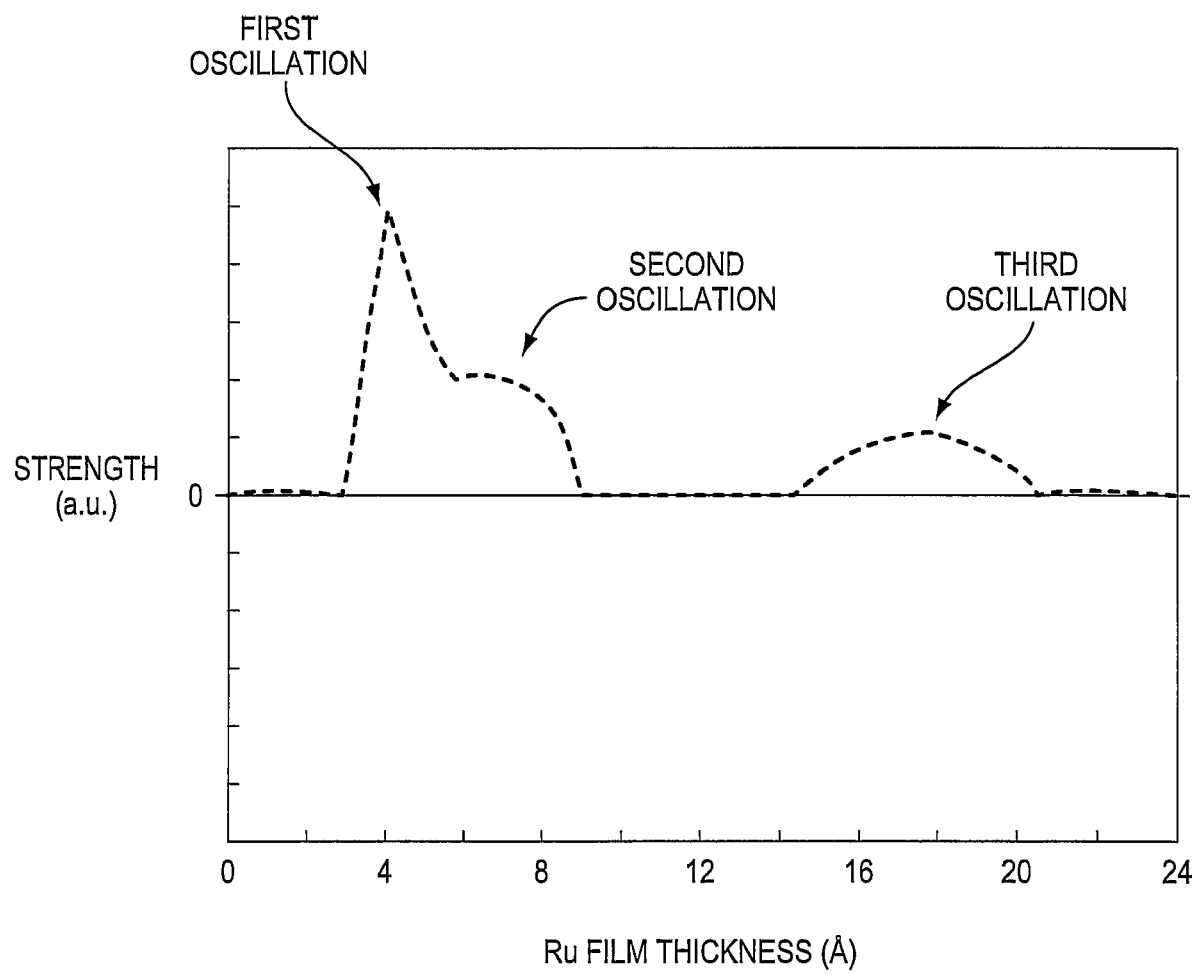
FIG. 9 is a graph illustrating the oscillation of antiparallel coupling across a Ru spacer layer over different thicknesses of the Ru spacer layer in an exemplary embodiment.

In TMR element 700, Ru spacer layer 715 is thinner than traditional TMR elements. In a typical TMR element, the Ru spacer between a pinned (keeper) and a pinned (reference layer) is about 8 Å. In TMR element 700, the Ru spacer layer 715 is less than about 5 Å. The thinner Ru spacer layer 715 enhances the antiparallel coupling across Ru spacer layer 715 between pinned (keeper) layer 714 and pinned (reference) layer 716. FIG. 9 is a graph illustrating the oscillation of antiparallel coupling across Ru spacer layer 915 over different thicknesses of the Ru spacer layer in an exemplary embodiment. It shows that interlayer coupling corresponding to a thinner Ru spacer layer 715 (first oscillation) is stronger than that for a thicker Ru spacer layer 715 (second oscillation). As is evident in FIG. 9, antiparallel coupling oscillates as a function of the thickness of Ru spacer layer 715. For this embodiment, the thickness of Ru spacer layer 715 is selected to be in the first oscillation, which is less than about 5 Å. The thickness of a typical Ru spacer layer is selected to be in the second oscillation.

Figure 10:
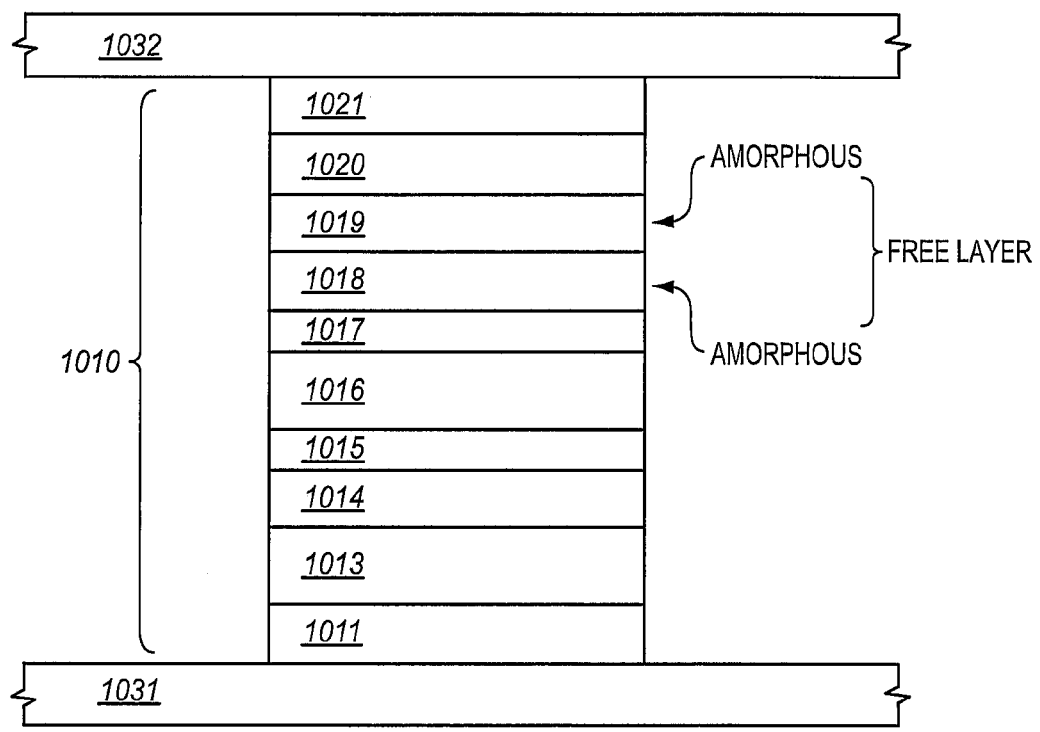
FIG. 10 illustrates a TMR element in another exemplary embodiment.

FIG. 10 illustrates a TMR element 1000 in another exemplary embodiment. FIG. 10 is a view from the ABS of TMR element 1000. TMR element 1000 is a detailed embodiment that is in no way intended to limit the scope of the invention, as exemplary layers of TMR element 1000 are shown. Those skilled in the art understand that TMR element 1000 may include other layers in other exemplary embodiments.

In FIG. 10, TMR element 1000 includes a TMR sensor 1010 sandwiched between a first shield 1031 and a second shield 1032. TMR sensor 1010 includes a seed layer 1011 formed from Ta, and an AFM pinning layer 1013 formed from PtMn (e.g., PtMn62). TMR sensor 1010 also includes a pinned layer structure comprising a ferromagnetic pinned (kreeper) layer 1014 formed from CoFe (e.g., CoFe10), a nonmagnetic spacer layer 1015 formed from Ru, and a ferromagnetic amorphous pinned (reference) layer 1016 formed from CoFeB. TMR sensor 1010 further includes a tunnel barrier layer 1017 formed from magnesium oxide, a first ferromagnetic amorphous free layer 1018 formed from CoFeB, a second ferromagnetic amorphous free layer 1019 formed from CoFeB, a first cap layer 1020 formed from Ru, and a second cap layer 1021 formed from Ta. The materials given for the layers of TMR sensor 1010 are just examples and other materials may be used.

The following lists some exemplary thicknesses of TMR sensor 1010. Seed layer 1011 formed from Ta is approximately 30 Å, AFM pinning layer 1013 formed from PtMn is approximately 154 Å, pinned (keeper) layer 1014 formed from CoFe is approximately 23 Å, spacer layer 1015 formed from Ru is less than about 5 Å, pinned (reference) layer 1016 formed from CoFeB is approximately 26 Å, tunnel barrier layer 1017 is approximately 9 Å, the first amorphous free layer 1018 formed from CoFeB is approximately 17 Å, the second amorphous free layer 1019 formed from CoFeB is between about 10-30 Å, the first cap layer 1020 formed from Ru is approximately 60 Å, and the second cap layer 1021 formed from Ta is approximately 30 Å. The thicknesses provided above are just examples and other material thicknesses may be used.

TMR element 1000 provides similar advantages over prior TMR elements as described in FIG. 7.

Figure 11:
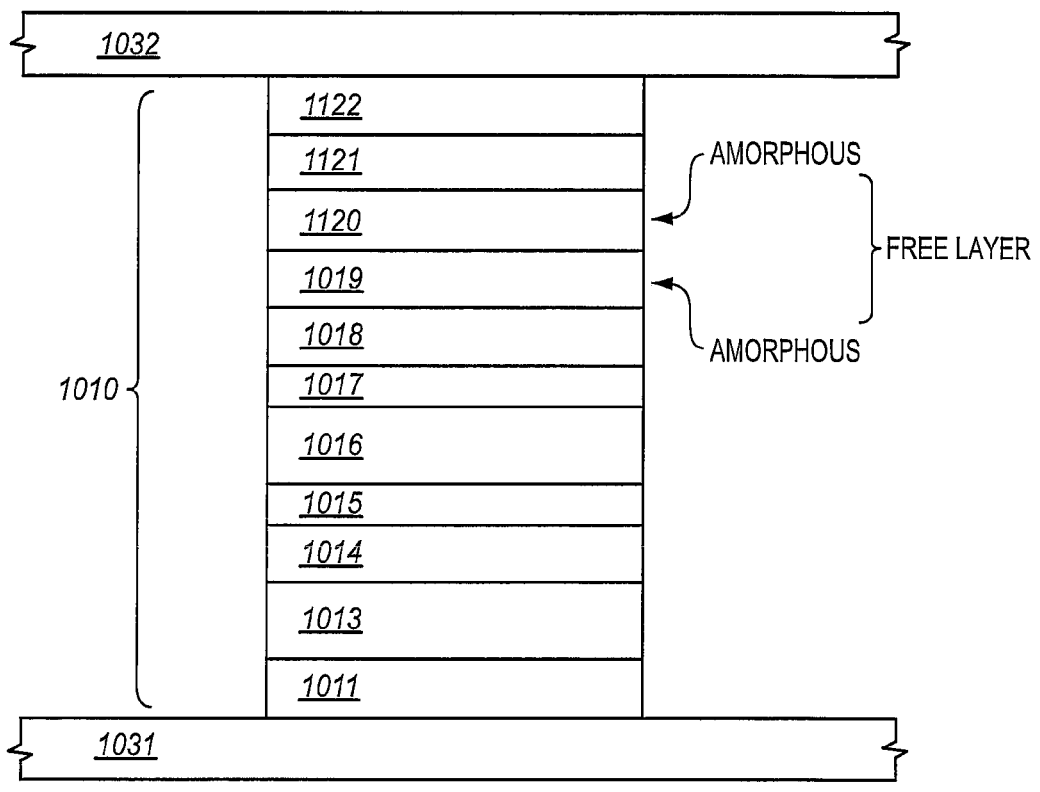
FIG. 11 illustrates a TMR element in another exemplary embodiment.

FIG. 11 illustrates TMR element 1000 in another exemplary embodiment. In FIG. 11, the cap layers are different in TMR element 1000 than in FIG. 10. In FIG. 11, TMR element 1000 includes three cap layers, which are a first cap layer 1120 formed from Ru (approximately 60 Å), a second cap layer 1121 formed from Ta (approximately 30 Å), and a third cap layer 1122 formed from Ru (approximately 40 Å).

Figure 12:
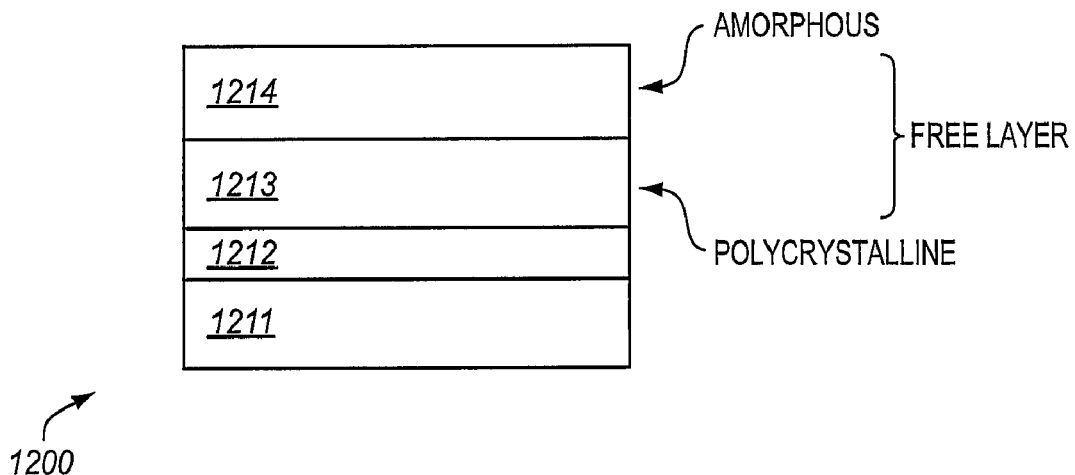
FIG. 12 illustrates a TMR element in another exemplary embodiment.
Figure 13:
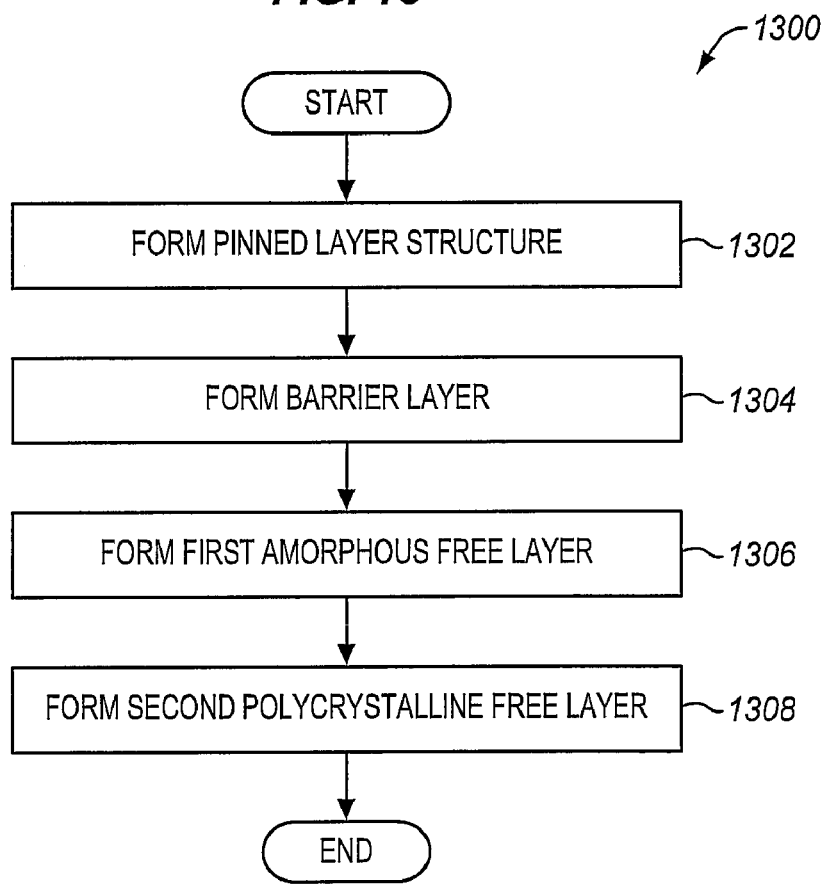
FIG. 13 is a flow chart illustrating a method of fabricating the TMR element shown in FIG. 12 in another exemplary embodiment.
Figure 14:
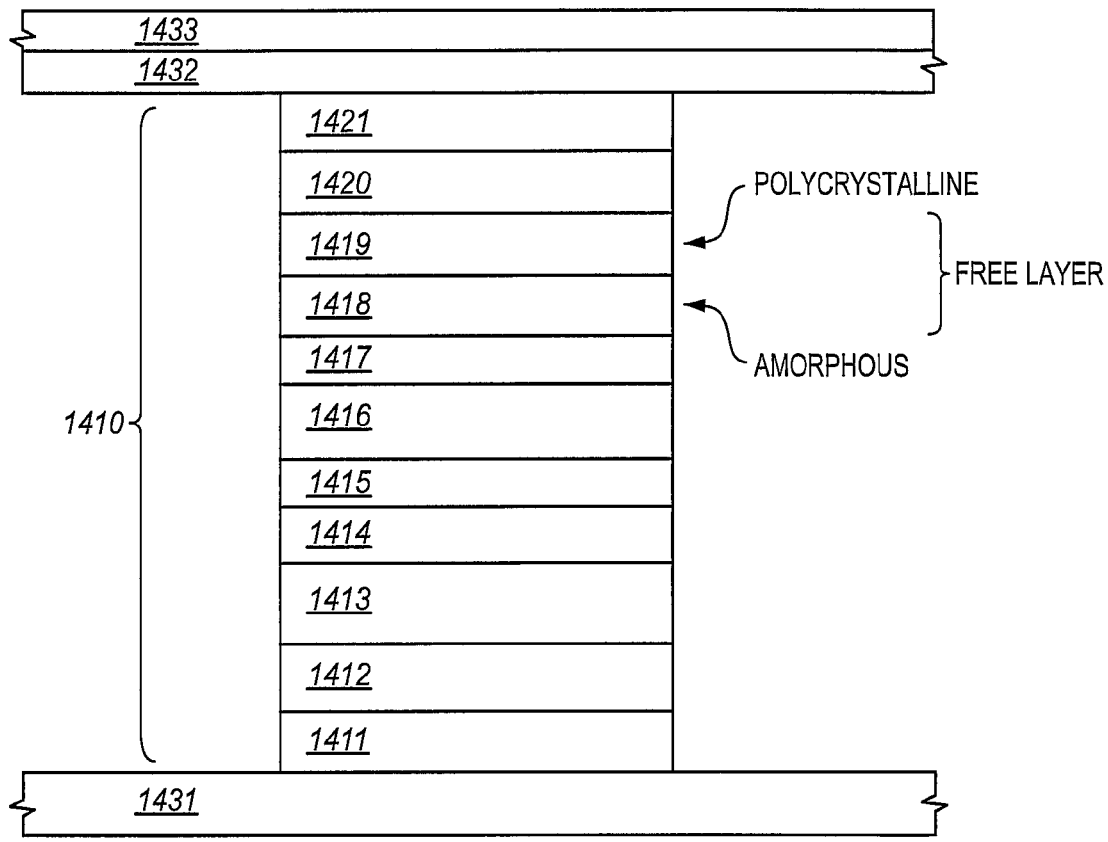
FIG. 14 illustrates a TMR element in another exemplary embodiment.

Dual Polycrystalline/Amorphous Free Layers—FIGS. 12-14

FIG. 12 illustrates a TMR element 1200 in an exemplary embodiment of the invention. FIG. 12 is a view from the air bearing surface (ABS) of TMR element 1200. TMR element 1200 includes a ferromagnetic pinned layer structure 1211, a tunnel barrier layer 1212, a first ferromagnetic polycrystalline free layer 1213, and a second ferromagnetic amorphous free layer 1214. Those skilled in the art understand that TMR element 1200 may include other layers in other exemplary embodiments, such as biasing layers, seed layers, shields, etc.

FIG. 13 is a flow chart illustrating a method 1300 of fabricating TMR element 1200 shown in FIG. 12 in an exemplary embodiment. The steps of the flow chart in FIG. 13 are not all inclusive and may include other steps not shown. For instance, a shield may be formed or deposited on a substrate, one or more seed layers may be formed or deposited, an AFM pinning layer may be formed or deposited, etc.

In step 1302, a ferromagnetic pinned layer structure 1211 is formed. Pinned layer structure 1211 may be a simple pinned structure or an AP-pinned structure. Pinned layer structure 1211 may be formed from polycrystalline materials such as CoFe, or may be formed from amorphous materials such as CoFeB. In step 1304, a tunnel barrier layer 1212 is formed. Tunnel barrier layer 1212 may be formed from magnesium oxide, aluminum oxide, or a similar material.

In step 1306, a first ferromagnetic polycrystalline free layer 1213 is formed. In step 1308, a second ferromagnetic amorphous free layer 1214 is formed. These layers may be formed in many desired ways.

The first polycrystalline free layer 1213 is formed with a polycrystalline material, such as CoFe. The second amorphous free layer 1214 is formed with amorphous materials, such as CoFeB. When the second amorphous free layer 1214 is termed "amorphous", the free layer 1214 is amorphous as formed or deposited. When amorphous materials are grown on polycrystalline materials, the amorphous materials can take on a polycrystalline structure on the surface touching the polycrystalline material. Thus, the second amorphous free layer 1214 may partially take on a polycrystalline structure after being deposited or annealed, all of which is within the scope of the invention.

The dual free layers 1213-1214 in FIG. 12 provide improved performance over prior TMR elements that implement either a single amorphous or a single polycrystalline free layer or implement multilayer free layer using CoFe and NiFe polycrystalline materials (see FIG. 12). In one example, the first polycrystalline free layer 1213 may have a composition optimized for TMR while the second amorphous free layer 1214 may have a composition optimized for magnetostriction. If the first polycrystalline free layer 1213 is comprised of CoFe, then to optimize for TMR the first polycrystalline free layer 1213 may have a first atomic percentage of Fe (e.g., a composition of approximately CoFe14) that is desirable or acceptable for TMR. If the second amorphous free layer 1214 is comprised of CoFeB, then to optimize for magnetostriction the second amorphous free layer 1214 may have a second atomic percentage of Fe (e.g., a composition of approximately CoFe8B) that is less than the first atomic percentage of Fe on the first polycrystalline free layer 1213.

Because Fe substantially contributes to the magnetostriction of a free layer formed from CoFe or CoFeB, the reduction in Fe in the second amorphous free layer 1214 is optimized for magnetostriction as compared to the first polycrystalline free layer 1213. However, because the first polycrystalline free layer 1213 has a higher concentration of Fe as compared to the second amorphous free layer 1214, the first polycrystalline free layer 1213 is optimized for TMR.

As in FIG. 3, the second amorphous free layer 1214 may be exposed to oxygen to improve performance. More particularly, the top surface of the second amorphous free layer 1214 may be exposed to oxygen according to many different desired methods. For instance, oxygen may be applied to the top surface of the second amorphous free layer 1214 at a particular pressure (e.g., $10^{-4}$ TORR) and temperature (e.g., room temperature) for a time period (e.g., 60 seconds). In another example, an oxygen plasma process may be used to expose the second amorphous free layer 1214 to oxygen. In another example, the second amorphous free layer 1214 may be exposed to an oxygen radical.

TMR element 1200 may further include a cap layer structure just as described in FIG. 5.

FIG. 14 illustrates a TMR element 1400 in another exemplary embodiment. FIG. 14 is a view from the ABS of TMR element 1400. TMR element 1400 is a detailed embodiment that is in no way intended to limit the scope of the invention, as exemplary layers of TMR element 1400 are shown. Those skilled in the art understand that TMR element 1400 may include other layers in other exemplary embodiments.

In FIG. 14, TMR element 1400 includes a TMR sensor 1410 sandwiched between a first shield 1431 and a second shield 1433. The first shield 1431 and the second shield 1433 may be formed from NiFe or a similar material. The top lead layer 1432 is formed from a conductive but non-magnetic material, such as Ta. Its main purpose is to set the desired spacing between the two magnetic shields 1431 and 1433. TMR sensor 1410 includes a first seed layer 1411 formed from Ta, and a second seed layer 1412 formed from Ru, and an antiferromagnetic (AFM) pinning layer 1413 formed from IrMnCr. TMR sensor 1410 also includes a pinned layer structure comprising a ferromagnetic pinned (keeper) layer 1414 formed from CoFe, a nonmagnetic spacer layer 1415 formed from Ru, and a ferromagnetic amorphous pinned (reference) layer 1416 formed from CoFeB. TMR sensor 1410 further includes a tunnel barrier layer 1417 formed from magnesium oxide, a first ferromagnetic polycrystalline free layer 1418 formed from CoFe14, a second ferromagnetic amorphous free layer 1419 formed from CoFe8B, a first cap layer 1420 formed from Ru, and a second cap layer 1421 formed from Ta. The materials given for the layers of TMR sensor 1410 are just examples and other materials may be used.

The following lists some exemplary thicknesses of TMR sensor 1410. The first seed layer 1411 formed from Ta is approximately 30 Å, the second seed layer 1412 formed from Ru is approximately 20 Å, AFM pinning layer 1413 formed from IrMnCr is approximately 60 Å, pinned (keeper) layer 1414 formed from CoFe is approximately 18 Å, spacer layer 1415 formed from Ru is less than about 5 Å, pinned (reference) layer 1416 formed from CoFeB is approximately 26 Å, tunnel barrier layer 1417 is approximately 9 Å, the first polycrystalline free layer 1418 formed from CoFe is approximately 5 Å, the second amorphous free layer 1419 formed from CoFeB is between about 10-30 Å, the first cap layer 1420 formed from Ru is approximately 60 Å, and the second cap layer 1421 formed from Ta is approximately 30 Å. The thicknesses provided above are just examples and other material thicknesses may be used.

TMR element 1400 differs from prior TMR elements in that the free layer comprises a dual layer structure of a ferromagnetic polycrystalline free layer 1418 and a ferromagnetic amorphous free layer 1419. The first polycrystalline free layer 1418 may have a composition of approximately CoFe14, while the second amorphous free layer 1419 has a composition of approximately CoFe8B. The higher content of Fe in the first polycrystalline free layer 1418 is optimized for TMR while the lower content of Fe in the second amorphous free layer 1419 is optimized for magnetostriction.

The second amorphous free layer 1419 is exposed to oxygen during fabrication in a manner as described in FIG. 4. The oxygen treatment reduces the magnetostriction of the free layer of TMR element 1400, even to negative levels. FIG. 8 is a graph illustrating magnetostriction as a function of free layer composition that applies to TMR element 1400.

Figure 16:
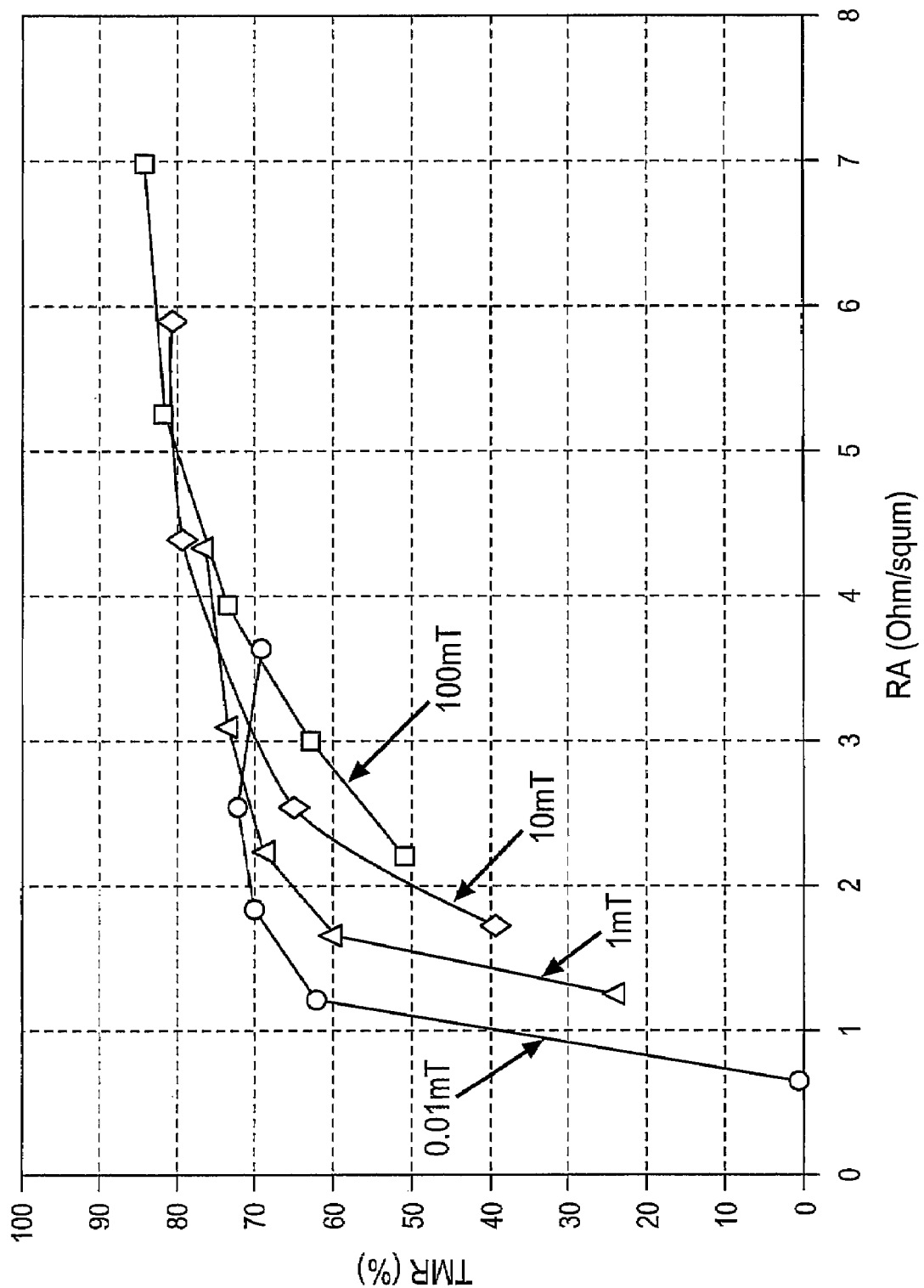
FIG. 16 is a graph illustrating RA and TMR of a TMR element as a function of oxygen treatment in an exemplary embodiment.

Another oxygen treatment may be applied to further improve performance. TMR sensor 1400 includes tunnel barrier layer 1417. Tunnel barrier layer 1417 is formed in a two-step process. First, the MgO barrier layer 1417 is reactively sputtered from a Mg target in the presence of Oxygen. Secondly, the MgO barrier layer 1417 is subjected to an additional Oxygen treatment to further improve barrier quality. Oxygen flow in the first step is selected so that the Mg target is not poisoned during the time required to deposit the MgO barrier layer 1417 of necessary thickness. The Oxygen treatment in the second step is optimized depending on desired RA value. FIG. 16 shows that for low RA, low Oxygen pressure during the second Oxygen treatment step is preferable. In particular for RA less than 2 $\Omega\mu m^2$, oxygen partial pressures less than 0.01 mTorr for 60 second are preferred.

In TMR element 1400, Ru spacer layer 1415 is thinner than traditional TMR elements. In a typical TMR element, the Ru spacer between a pinned (keeper) layer and a pinned (reference layer) is about 8 Å. In TMR element 1400, the Ru spacer layer 1415 is less than about 5 Å. The thinner Ru spacer layer 1415 enhances the antiparallel coupling across Ru spacer layer 1415 between pinned (keeper) layer 1414 and pinned (reference) layer 1416.

The free layer for TMR elements described herein may be formed from a broad range of CoFeB based dual-layer structures where the layers are separately optimized for TMR and magnetostriction. For instance, the dual-layer structure may be comprised of a first free layer of $Co_{100-u-v}Fe_uB_v$ and a second free layer of $Co_{100-x-y}Fe_xB_y$, where u and x represent the Fe content in atomic percent in the first and second free layer, respectively, and where v and y represents the B content in atomic percent in the first and second free layer, respectively.

For the first free layer $Co_{100-u-v}Fe_uB_v$, Fe is in the range $0<u<80$ and, and B is in the range $0<v<30$. For B concentration below approximately 5%, CoFeB is no longer amorphous but polycrystalline.

For the second free layer $Co_{100-x-y}Fe_xB_y$, Fe is in the range $0<x<50$ and, and B is in the range $5<y<30$. Magnetostriction is minimized by low Fe concentrations, and by B concentrations close to 5% or close to 30%.

In one embodiment, the dual-layer structure includes a first amorphous free layer and a second amorphous free layer. In another embodiment, the dual-layer structure includes a first polycrystalline free layer and a second amorphous free layer. In any of these embodiments, the compositions of the first free layer and the second free layer of the dual layer structure differ to provide improved TMR performance and controlled magnetostriction.

Figure 15:
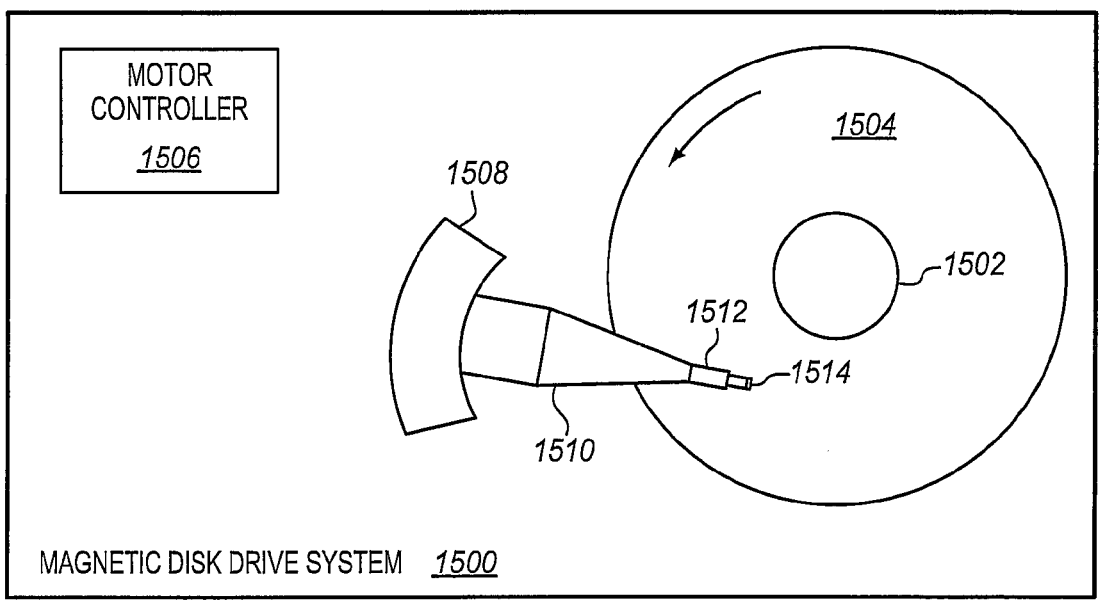
FIG. 15 illustrates a magnetic disk drive system in an exemplary embodiment.

Magnetic Disk Drive System—FIG. 15

The TMR elements shown in FIGS. 1, 3, 5, 7, 10, 11, 12 and 14 may be implemented in a magnetic disk drive system, or in other magnetic applications such as memories. FIG. 15 illustrates a magnetic disk drive system 1500 in an exemplary embodiment. Magnetic disk drive system 1500 includes a spindle 1502, a magnetic recording medium 1504, a motor controller 1506, an actuator 1508, an actuator arm 1510, a suspension arm 1512, and a recording head 1514. Spindle 1502 supports and rotates magnetic recording medium 1504 in the direction indicated by the arrow. A spindle motor (not shown) rotates spindle 1502 according to control signals from motor controller 1506. Recording head 1514 is supported by suspension arm 1512 and actuator arm 1510. Actuator arm 1510 is connected to actuator 1508 that is configured to rotate in order to position recording head 1514 over a desired track of magnetic recording medium 1504. Magnetic disk drive system 1500 may include other devices, components, or systems not shown in FIG. 15. For instance, a plurality of magnetic disks, actuators, actuator arms, suspension arms, and recording heads may be used.

When magnetic recording medium 1504 rotates, an air flow generated by the rotation of magnetic disk 1504 causes an air bearing surface (ABS) of recording head 1514 to ride on a cushion of air at a particular height above magnetic disk 1504. The height depends on the shape of the ABS. As recording head 1514 rides on the cushion of air, actuator 1508 moves actuator arm 1510 to position a read element (not shown) and a write element (not shown) in recording head 1514 over selected tracks of magnetic recording medium 1504. The read element in recording head 1514 may comprise a TMR element as described herein in the above FIGS.

Although specific embodiments were described herein, the scope of the invention is not limited to those specific embodiments. The scope of the invention is defined by the following claims and any equivalents thereof.

We claim:

1. A tunneling magnetoresistance (TMR) element comprising:
    a ferromagnetic pinned layer structure;
    a nonmagnetic barrier layer formed on the ferromagnetic pinned layer structure;
    a first ferromagnetic amorphous free layer comprised of CoFeB formed on the nonmagnetic barrier layer; and
    a second ferromagnetic amorphous free layer comprised of CoFeB formed on the first ferromagnetic amorphous free layer;
    wherein the first ferromagnetic amorphous free layer has a first atomic percentage of Fe and the second ferromagnetic amorphous free layer has a second atomic percentage of Fe;
    wherein the second atomic percentage of Fe is lower than the first atomic percentage of Fe.

2. The TMR element of claim 1 wherein the second ferromagnetic amorphous free layer is exposed to oxygen during fabrication.

3. The TMR element of claim 1 wherein:
    the first ferromagnetic amorphous free layer has a composition optimized for TMR; and
    the second ferromagnetic amorphous free layer has a composition optimized for magnetostriction.

4. The TMR element of claim 1 wherein:
the first ferromagnetic amorphous free layer is comprised of CoFeB having an atomic percentage of Fe less than 80 and an atomic percentage of B in the range of 5 to 30; and
the second ferromagnetic amorphous free layer is comprised of CoFeB having an atomic percentage of Fe less than 50 and an atomic percentage of B in the range of 5 to 30.

5. The TMR element of claim 1 further comprising:
a first cap layer formed from Ru adjacent to the second ferromagnetic amorphous free layer; and
a second cap layer formed from Ta adjacent to the first cap layer.

6. The TMR element of claim 1 further comprising:
an antiferromagnetic (AFM) pinning layer adjacent to the ferromagnetic pinned layer structure; and
a seed layer structure that includes either a layer of Ta, or a first layer of Ta and a second layer of Ru.

7. The TMR element of claim 6 wherein the ferromagnetic pinned layer structure includes:
a first ferromagnetic pinned layer adjacent to the AFM pinning layer;
a nonmagnetic spacer layer formed from Ru adjacent to the first ferromagnetic pinned layer; and
a second ferromagnetic amorphous pinned layer adjacent to the nonmagnetic spacer layer.

8. The TMR element of claim 7 wherein the thickness of the Ru nonmagnetic spacer layer is selected to be in the first oscillation of antiparallel coupling between the first ferromagnetic pinned layer and the second ferromagnetic amorphous pinned layer.

9. A method of fabricating a tunneling magnetoresistance (TMR) element, the method comprising:
forming a ferromagnetic pinned layer structure;
forming a nonmagnetic barrier layer on the ferromagnetic pinned layer structure;
forming a first ferromagnetic amorphous free layer of CoFeB on the nonmagnetic barrier layer; and
forming a second ferromagnetic amorphous free layer of CoFeB on the first ferromagnetic amorphous free layer;
wherein the first ferromagnetic amorphous free layer has a first atomic percentage of Fe and the second ferromagnetic amorphous free layer has a second atomic percentage of Fe;
wherein the second atomic percentage of Fe is lower than the first atomic percentage of Fe.

10. The method of claim 9 further comprising:
exposing the second ferromagnetic amorphous free layer to oxygen.

11. The method of claim 10 further comprising:
forming a first cap layer with a material having a substantially low reactivity with oxygen.

12. The method of claim 9 wherein forming a first cap layer comprises:
forming a layer of Ru; and
forming a layer of Ta.

13. The method of claim 9 wherein:
the first ferromagnetic amorphous free layer has a composition optimized for TMR; and
the second ferromagnetic amorphous free layer has a composition optimized for magnetostriction.

14. The method of claim 9 wherein:
forming a first ferromagnetic amorphous free layer comprises forming the first ferromagnetic amorphous free layer from CoFeB having an atomic percentage of Fe less than 80 and an atomic percentage of B in the range of 0 to 30; and
forming a second ferromagnetic amorphous free layer comprises forming the second ferromagnetic amorphous free layer from CoFeB having an atomic percentage of Fe less than 50 and an atomic percentage of B in the range of 5 to 30.

15. The method of claim 9 wherein forming a ferromagnetic pinned layer structure comprises:
forming a first ferromagnetic pinned layer;
forming a nonmagnetic spacer layer of Ru; and
forming a second ferromagnetic amorphous pinned layer.

16. The method of claim 15 wherein the thickness of the Ru nonmagnetic spacer layer is selected to be in the first oscillation of antiparallel coupling between the first ferromagnetic pinned layer and the second ferromagnetic amorphous pinned layer.

17. The method of claim 9 further comprising:
before forming the ferromagnetic pinned layer structure, forming a seed layer structure and forming an antiferromagnetic (AFM) pinning layer.

18. The method of claim 17 wherein forming a seed layer structure comprises:
forming a first layer of Ta; and
forming a second layer of Ru.

19. A tunneling magnetoresistance (TMR) element comprising:
a ferromagnetic pinned layer structure;
a nonmagnetic barrier layer formed on the ferromagnetic pinned layer structure; and
a free layer having a dual-layer structure formed on the nonmagnetic barrier layer, wherein the free layer includes:
a first ferromagnetic amorphous free layer formed from CoFeB having an Fe content optimized for TMR; and
a second ferromagnetic amorphous free layer formed from CoFeB having an Fe content optimized for magnetostriction that is less than the Fe content of the first ferromagnetic free layer.

* * * * *

UNITED STATES PATENT AND TRADEMARK OFFICE
CERTIFICATE OF CORRECTION

PATENT NO. : 7,751,156 B2  Page 1 of 1
APPLICATION NO. : 11/536891
DATED : July 6, 2010
INVENTOR(S) : Mauri et al.

It is certified that error appears in the above-identified patent and that said Letters Patent is hereby corrected as shown below:

At column 8, line 41, please correct "kreeper" to read "keeper".

Signed and Sealed this

Twenty-first Day of September, 2010

David J. Kappos
*Director of the United States Patent and Trademark Office*